(12) United States Patent
Yoshimoto et al.

(10) Patent No.: US 8,107,242 B2
(45) Date of Patent: Jan. 31, 2012

(54) ELECTRICAL EQUIPMENT UNIT

(75) Inventors: Akio Yoshimoto, Shiga (JP); Mitsuhiro Tanaka, Shiga (JP)

(73) Assignee: Daikin Industries, Ltd,, Osaka (JP)

( * ) Notice: Subject to any disclaimer, the term of this patent is extended or adjusted under 35 U.S.C. 154(b) by 0 days.

(21) Appl. No.: 12/601,839

(22) PCT Filed: May 29, 2008

(86) PCT No.: PCT/JP2008/059899
§ 371 (c)(1),
(2), (4) Date: Nov. 25, 2009

(87) PCT Pub. No.: WO2009/004875
PCT Pub. Date: Jan. 8, 2009

(65) Prior Publication Data
US 2010/0177483 A1 Jul. 15, 2010

(30) Foreign Application Priority Data

Jun. 29, 2007 (JP) .................................. 2007-172473
Apr. 14, 2008 (JP) .................................. 2008-104949

(51) Int. Cl.
*H05K 7/20* (2006.01)
*H05K 7/14* (2006.01)

(52) U.S. Cl. .......................... 361/719; 361/721; 361/796

(58) Field of Classification Search ........................ None
See application file for complete search history.

(56) References Cited

U.S. PATENT DOCUMENTS

| | | | | |
|---|---|---|---|---|
| 5,461,256 A * | 10/1995 | Yamada et al. | ............... | 257/679 |
| 5,719,753 A * | 2/1998 | Taylor | ........................... | 361/812 |
| 6,466,451 B2 * | 10/2002 | Mizuno et al. | ............... | 361/796 |
| 6,590,777 B2 * | 7/2003 | Morino et al. | ............... | 361/736 |
| 6,875,029 B2 * | 4/2005 | Kawabata et al. | ........... | 439/76.2 |
| 6,958,535 B2 * | 10/2005 | Hirano et al. | ................ | 257/707 |
| 7,173,824 B2 * | 2/2007 | Laurent et al. | ............... | 361/707 |
| 7,369,415 B2 * | 5/2008 | Kojima | ........................ | 361/789 |
| 7,417,861 B2 * | 8/2008 | Kikuchi et al. | .............. | 361/718 |
| 7,417,873 B2 * | 8/2008 | Kadoya et al. | ............... | 361/797 |
| 7,448,909 B2 * | 11/2008 | Regnier et al. | ........... | 439/607.05 |
| 7,643,296 B2 * | 1/2010 | Yamada et al. | ............... | 361/704 |
| 2006/0171127 A1 | 8/2006 | Kadoya et al. | | |

FOREIGN PATENT DOCUMENTS

| | | |
|---|---|---|
| JP | 7-321472 A | 12/1995 |
| JP | 9-18176 A | 1/1997 |
| JP | 2004-111435 A | 4/2004 |
| JP | 2004-111502 A | 4/2004 |
| JP | 2006-190726 A | 7/2006 |
| JP | 2007-184507 A | 7/2007 |

* cited by examiner

*Primary Examiner* — Boris Chervinsky

(74) *Attorney, Agent, or Firm* — Birch, Stewart, Kolasch & Birch, LLP

(57) ABSTRACT

A substrate includes a pair of surfaces opposing to each other in a direction. First electronic components are provided on one surface. Second electronic components lower than a maximum value of the height of the first electronic components in a direction are provided on the other surface. Insulating resin includes a covering part adhering and covering the second electronic components and the other surface, and side surface part extending from the periphery of the substrate to a side of the second electronic components along the direction. A lid covers the first electronic components from an opposite side of the substrate, and is fixed to the side surface part from the opposite side of the substrate.

15 Claims, 9 Drawing Sheets

F I G . 1 6
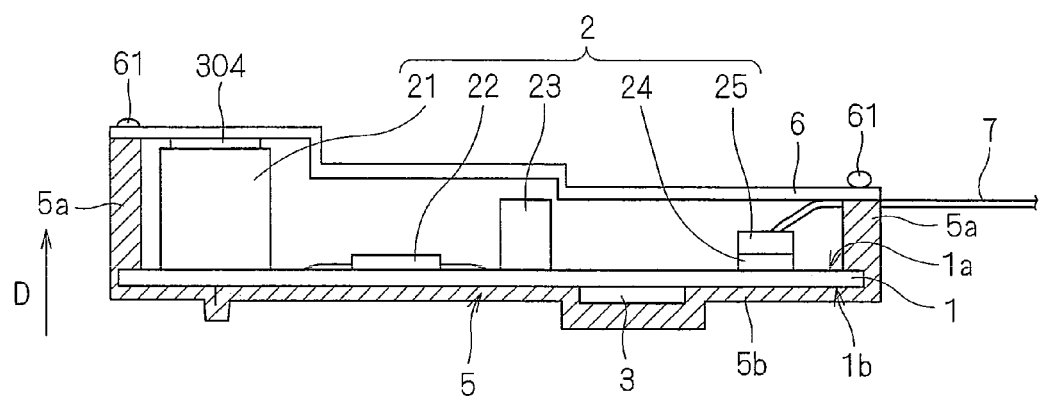

ELECTRICAL EQUIPMENT UNIT

TECHNICAL FIELD

The present invention relates to an electrical equipment unit, and specifically relates to a resin-sealed electrical equipment unit.

BACKGROUND ART

Patent document 1 discloses a technology adhering and covering electronic components and a substrate with insulating resin in a substrate with the electronic components mounted thereon. More specifically, a substrate is housed in a mold having a shape formed along the contour including the electronic components to be covered and a substrate with those electronic components mounted thereon, and the insulating resin is injected therein.

Further, patent document 2 discloses a technology covering electronic components, which are undesirable to be adhered and covered with resin, with a typical cover, and covering other electronic components by adhering with resin. More specifically, a substrate is housed in a mold formed along the contour of electronic components to be covered, electronic components provided with a cover, and a substrate including these, and the insulating resin is injected therein. The mold is provided with a space formed so as to make contact with the cover in a surface parallel to the substrate.
Patent document 1: Japanese Patent Application Laid-Open No. 2004-111435
Patent document 2: Japanese Patent Application Laid-Open No. 2006-190726

DISCLOSURE OF INVENTION

Problems to be Solved by the Invention

However, in the technology described in the patent document 1, it is necessary to form a shape in a mold along the contour of the electronic components to be covered, so that it is required to enhance the accuracy of positions and size of the electronic components and the accuracy of the mold as the electronic components are comparatively taller with respect to the substrate.

Moreover, in the technology described in the patent document 2, it is necessary to form a space in a shape so as to make contact with the cover in a surface parallel to the substrate, and it is required to enhance the accuracy in a direction parallel to the substrate.

It is therefore an object of the present invention to provide an electrical equipment unit reducing the required accuracy of a mold.

Means for Solving the Problems

A first aspect of an electrical equipment unit of the invention includes a substrate (1) including a first surface (1a) and a second surface (1b) opposing to each other in a predetermined direction (D); at least one or more first electronic components (2, 21 to 25; 26; 27; 28) provided on the first surface; at least one or more second electronic components (3) provided on the second first surface; an insulating resin (5) including a covering part (5b) which adheres and covers the second surface and at least one of the electronic components having the height lower than a maximum value of the height of the first electronic components in the predetermined direction (D) out of the second electronic components, and a side surface part (5a) extending from the periphery of the substrate to a side of the first electronic components in the predetermined direction; and a lid (6) which is a different body from the insulating resin and fixed to the side surface part at an opposite side of the substrate, covering the first electronic components from the opposite side of the substrate.

According to a second aspect of the electrical equipment unit of the invention, in the first aspect of the electrical equipment unit, the height of the side surface part (5a) in the predetermined direction (D) is lower than the maximum value of the height of the first electronic components (2, 21 to 25; 26; 27; 28).

According to a third aspect of the electrical equipment unit of the invention, in the second aspect of the electrical equipment unit, a plurality of the first electronic components (2, 21 to 25; 26; 27; 28) are provided on the first surface (1a), each having different height in the predetermined direction (D), the height of one of the first electronic components provided at a position adjacent to the side surface part (5a) is lower than that of any one of other first electronic components, and a distance from the first surface to the lid at a side of the first surface at the position where one of the first electronic components is provided, is smaller than that from the first surface to the lid at a side of the first surface at the position where any one of other first electronic components having the height higher than that of one of the first electronic components is provided.

According to a fourth aspect of the electrical equipment unit of the invention, in the second aspect of the electrical equipment unit, the lid (6) includes a second side surface part (6b) extending from one end of the side surface part (5a) at the opposite side of the substrate (1) in the predetermined direction (D); and a plane part (6c) extending from one end of the second side surface part at the opposite side of the substrate in a direction parallel to the substrate.

According to a fifth aspect of the electrical equipment unit of the invention, the first aspect of the electrical equipment unit further includes a second substrate (11) disposed to oppose to the substrate (1) in the predetermined direction (D); and third electronic components (201 to 203; 204) provided on a surface (11a) of the second substrate at a side of said substrate, wherein the lid (6) covers the second substrate at the opposite side of the substrate.

According to a sixth aspect of the electrical equipment unit of the invention, the fifth aspect of the electrical equipment unit further includes fourth electronic components (211 to 213) provided on a surface (11b) of the second substrate (11) at the opposite side of the substrate (1); a third substrate (12) disposed to oppose to the second substrate at the opposite side of the substrate in the predetermined direction (D); and fifth electronic components (221, 222) provided on a surface (12a) of the third substrate at a side of the second substrate, wherein the lid (6) covers the third substrate from the opposite side of the substrate (1).

According to a seventh aspect of the electrical equipment unit of the invention, in any one of first to sixth aspects of the electrical equipment unit, at least one of the first electronic components (2) is a connector (24, 25), and any one of first to sixth aspects of the electrical equipment unit further includes trenches (6a, 5c) provided at a boundary of the lid (6) and the side surface part (5a); and a wiring (7) electrically connected to the connector and extending to outside through the trenches.

According to a eighth aspect of the electrical equipment unit of the invention, any one of first to seventh aspects of the electrical equipment unit further includes a sixth electronic component (32) provided on the second surface (1b) and having the height lower than the maximum value of the height of the first electronic components (2) in the predetermined direction (D); and a radiator (300) attached to the sixth electronic component at an opposite side of the second surface, making contact therewith, wherein the covering part (5b) covers the sixth electronic component except at least the contact part with the radiator, and the radiator makes contact with the covering part from the opposite side of the substrate.

According to a ninth aspect of the electrical equipment unit of the invention, in any one of first to eighth aspects of the electrical equipment unit, the side surface part (5a) covers a part of at least one of the first electronic components (28).

According to a tenth aspect of the electrical equipment unit of the invention, any one of first to ninth aspects of the electrical equipment unit further includes a second radiator (302) attached to at least one of the first electronic components (28) and extending to outside through the side surface part (5a).

According to a eleventh aspect of the electrical equipment unit of the invention, any one of first to tenth aspects of the electrical equipment unit further includes a connecting mechanism (53) buried in the side surface part (5a) and electrically connecting the substrate (1) and an external wiring (71).

According to a twelfth aspect of the electrical equipment unit of the invention, in the eleventh aspect of the electrical equipment unit, the connecting mechanism (53) includes a lead frame (29), one end of which is electrically connected to the substrate (1); and a conductive female screw (75) making contact with the lead frame and buried in the side surface part (5a) to fix the external wiring (71) by screwing.

According to a thirteenth aspect of the electrical equipment unit of the invention, in the eleventh aspect of the electrical equipment unit, the connecting mechanism (53) includes: a lead frame (29), one end of which is electrically connected to the substrate (1), and extending to outside through the side surface part (5a), and the side surface part (5a) has a connector-like shape surrounding the lead frame with respect to an extending direction of the lead frame extending at the other end.

According to a fourteenth aspect of the electrical equipment unit of the invention, any one of first to thirteenth aspects of the electrical equipment unit further includes a sealing member (4) air-tightly sealing between the lid (6) and the side surface part (5a).

According to a fifteenth aspect of the electrical equipment unit of the invention, any one of first to fourteenth aspects of the electrical equipment unit further includes a heat transfer member (304) making contact with the first electronic components (2, 21 to 25; 26; 27; 28) and the lid (6).

Effects of the Invention

According to the first aspect of the electrical equipment unit of the invention, the second electronic components covered by a covering part that is insulating resin are short, thus not requiring to enhance the accuracy of a mold. On the other hand, the first electronic components that are tall are air-tightly sealed by the side surface part formed with insulating resin, and the lid, thus not requiring to be covered with the insulating resin. The lid is fixed to the side surface part at the opposite side of the substrate, eliminating the need for the accuracy of a position of the side surface part in a direction parallel to the substrate, and thus reducing the required accuracy of the mold in forming the shape of the side surface part to the mold.

According to the second and fourth aspects of the electrical equipment unit of the invention, the heights of the side surface part are suppressed to reduce the amount of the insulating resin for that part, thus allowing to reduce the manufacturing cost.

According to the third aspect of the electrical equipment unit of the invention, the height of the side surface part at the position which one of the first electronic components is provided is allowed to be shorter so that the amount of the insulating resin for that part is reduced and the lid is dented in accordance with the height of one of the first electronic components, thus reducing the size of the electronic equipment unit.

According to the fifth aspect of the electrical equipment unit of the invention, the electronic equipment unit with the substrate and the second substrate mounted thereon is provided.

According to the sixth aspect of the electrical equipment unit of the invention, the electronic equipment unit with the substrate, the second substrate, and the third substrate mounted thereon is provided.

According to the seventh aspect of the electronic equipment unit of the invention, the connector is air-tightly sealed by the side surface part and the lid, thus eliminating the need for an expensive connector for waterproof and reducing the manufacturing cost.

According to the eighth aspect of the electronic equipment unit of the invention, after the sixth electronic component is covered with the insulating resin except the contact part, a radiator is attached to the sixth electronic component. Accordingly, it is unnecessary to house the radiator in the mold and form the shape of the radiator to the mold, thus allowing to reduce the required accuracy of the mold.

According to the ninth aspect of the electronic equipment unit of the invention, for instance, in the situation where temperature of a space surrounding the first electronic components is higher than that of outside air, the first electronic components radiate heat through the side surface part to the outside air, thus allowing to improve the effect of heat radiation of the first electronic components.

According to the tenth aspect of the electronic equipment unit of the invention, the effect of the heat radiation of the first electronic components is improved.

According to the eleventh aspect of the electronic equipment unit of the invention, the substrate and the external wiring are easily connected.

According to the twelfth aspect of the electronic equipment unit of the invention, the external wiring and the substrate are electrically connected by fixing with a screw.

According to the thirteenth aspect of the electronic equipment unit of the invention, the side surface part have a connector-like shape, thus easily and electrically connecting to a connector provided to the external wiring with the other end of the lead frame as a connector terminal.

According to the fourteenth aspect of the electrical equipment unit of the invention, the air tightness of the first electronic components is improved.

According to the fifteenth aspect of the electrical equipment unit of the invention, the heat radiation of the first electronic components is improved.

These and other objects, features, aspects and advantages of the present invention will become more apparent from the following detailed description of the present invention when taken in conjunction with the accompanying drawings.

BRIEF DESCRIPTION OF DRAWINGS

FIG. 16 is a plane view schematically showing a part of one example of an electrical equipment unit according to a fifth preferred embodiment.

BEST MODE FOR CARRYING OUT THE INVENTION

First Preferred Embodiment

Figure 1:
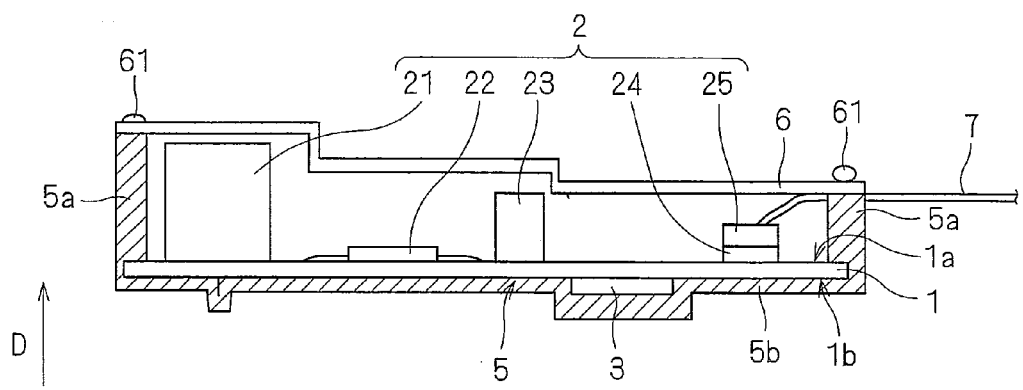
FIG. 1 is a block diagram schematically showing one example of an electrical equipment unit according to a first preferred embodiment.

FIG. 1 is a block diagram schematically showing a cross section of one example of the electrical equipment unit according to the first preferred embodiment, seen from a direction parallel to a substrate 1 (described later). The electrical equipment unit includes the substrate 1, electronic components 2 and 3, insulating resin 5, and a lid 6.

The substrate 1 includes surfaces 1a and 1b opposing to each other in a predetermined direction D.

The electronic components 2 are provided on the surface 1a. In FIG. 1, as the electronic components 2, insertion type electronic components 21 and 23 such as an electrolytic capacitor, a relay, a coil and the like, a surface mount type electronic component 22 such as a bare chip and the like, a connector 24, and a connector 25 coupled to the connector 24 are illustrated. A wiring 7 is attached to the connector 25 for electrically connecting to an external device. At least one or more electronic components 2 may be provided on the surface 1a.

The electronic component 3 is provided on the surface 1b. In FIG. 1, as the electronic component 3, a surface mount electronic component of small size such as a resistor, a diode, an IC, and the like is illustrated. At least one or more electronic components 3 may be provided.

The insulating resin 5 includes a covering part 5b and a side surface part 5a. The side surface part 5a is continuous from the covering part 5b, extending from the periphery of the substrate 1 to a side of the electronic components 2 in the direction D. The covering part 5b adheres and covers the electronic component 3. The electronic component 3 has the height lower than the maximum value of the height of the electronic component 2 in the direction D. In the case where a plurality of the electronic components 3 are provided, and the covering part 5b covers the plurality of the electronic components 3, an insulation distance among the electronic components 3 is allowed to be longer by the covering part 5b that is insulating resin. Accordingly, the intervals among the electronic components 3 that are covered are allowed to be shorter.

In the present preferred embodiment, the case where at least any one of the electronic components 3 is lower than the maximum value of the height of the electronic components 2 is assumed. At least any one of the electronic components 3 lower than this maximum value is covered by the covering part 5b. In the present preferred embodiment, the case where the one of the electronic components 3 having the height higher than this maximum value is covered by the covering part 5b, is not assumed.

The lid 6 is a different body from the insulating resin 5, and is fixed to the side surface part 5a at the opposite side of the substrate 1, covering the electronic components 2 from the opposite side of the substrate 1. The side surface part 5a and the lid 6 are fixed by screwing, for example, with a screw 61.

Figure 2:
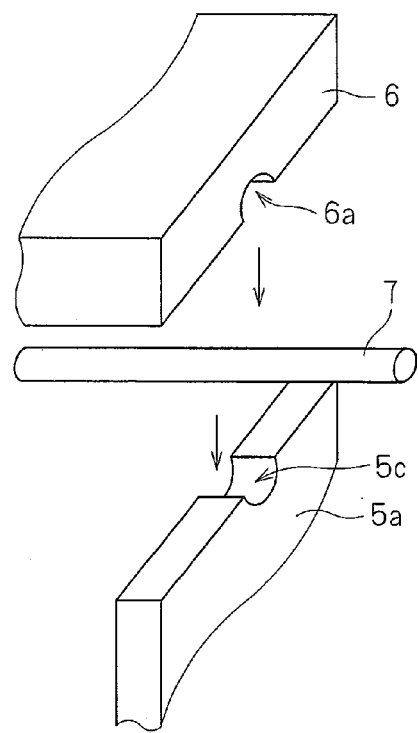
FIG. 2 is a perspective view schematically showing a part relating to a side surface part, a lid, and a wiring in the electrical equipment unit shown in FIG. 1.

A wiring 7 is provided to the connector 25, and is drawn to outside, for example, through a boundary of the lid 6 and the side surface part 5a. More specifically, as shown in FIG. 2, for example, the wiring 7 extends to outside through a through hole formed by a trench 6a provided in the lid 6 and a trench 5c provided in the side surface part 5a to oppose to the trench 6a. The trenches 6a and 5c are regarded to be provided to the boundary of the lid 6 and the side surface part 5a.

Figure 3:
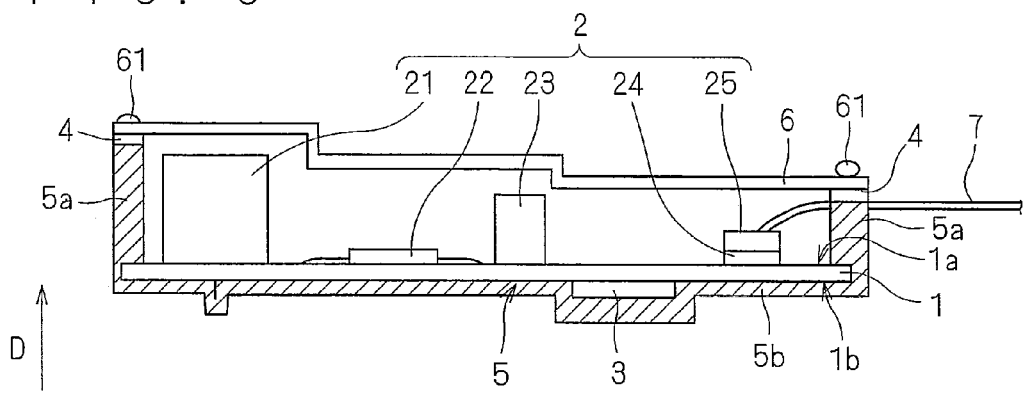
FIG. 3 is a block diagram schematically showing one example of the electrical equipment unit sealed with a sealing member.

In the electrical equipment unit configured as above, the electronic components 3 that are comparatively short are air-tightly sealed by the insulating resin 5 at a side of the surface 1b. The electronic components 2 that are comparatively tall are air-tightly sealed by the side surface part 5a and the lid 6 at a side of the surface 1a. In view of the airtightness, the boundary of the lid 6 and the side surface part 5a may be sealed with a sealing member, for example. FIG. 3 is a cross sectional view schematically showing one example of a configuration of the electrical equipment unit sealed with a sealing member. The electrical equipment unit further includes a sealing member 4 such as an O-ring, for example, comparing to the electrical equipment unit shown in FIG. 1. The sealing member 4 is interposed between the side surface part 5a and the lid 6. This improves the airtightness of the electronic components 2. The wiring 7, the trenches 6a and 5c may be sealed with such as a thermoplastic fluid sealant, for example. Both of the trenches 6a and 5c may be not necessarily provided, but only either one of the trenches may be provided. In this case, the airtightness of the electrical equipment unit may be secured by extending the wiring 7 to outside through the either one of the trenches and sealing a gap between the either one of the trenches and the wiring 7 with the sealing member and the like.

Figure 4:
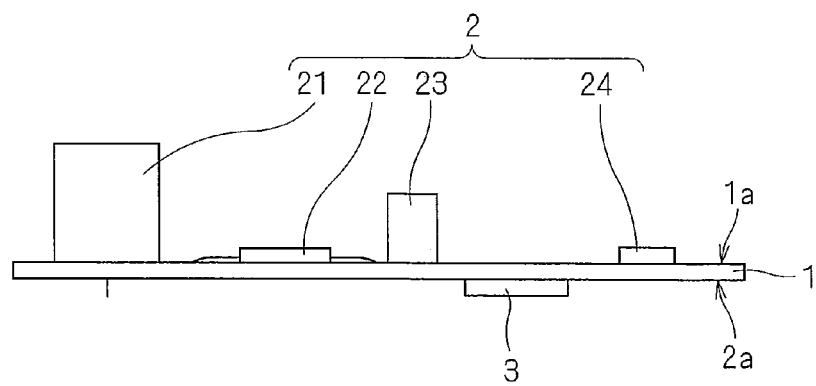
FIG. 4 is a view showing a manufacturing process of the electrical equipment unit shown in FIG. 1.
Figure 5:
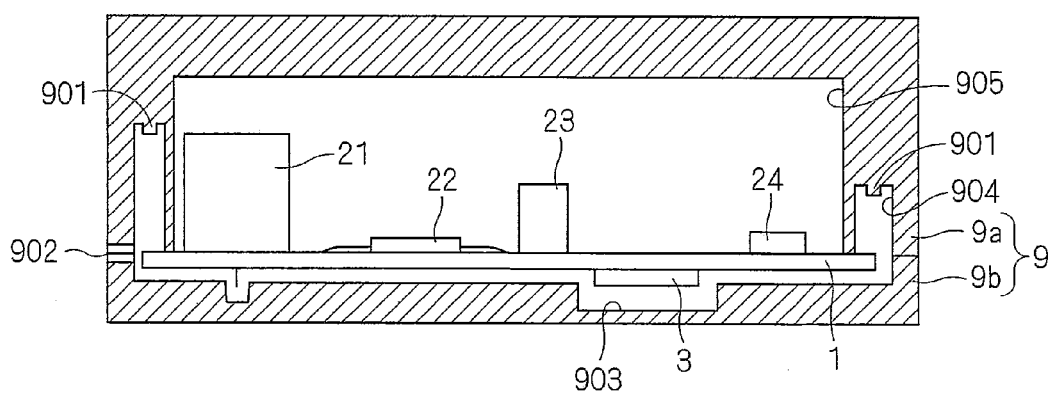
FIG. 5 is a view showing another manufacturing process of the electrical equipment unit shown in FIG. 1.
Figure 6:
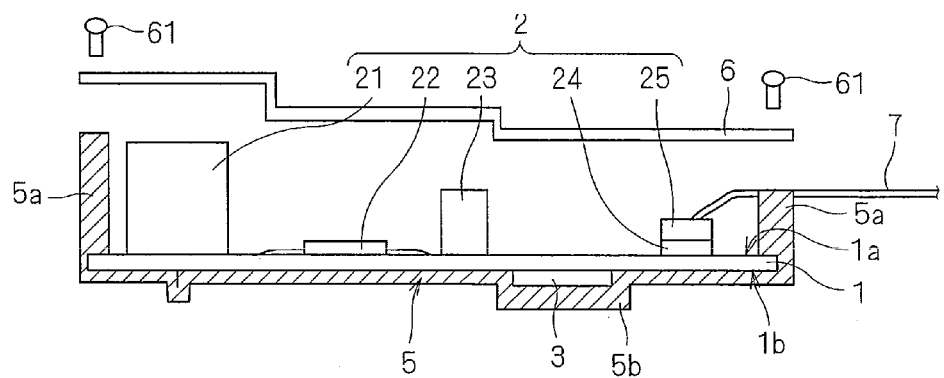
FIG. 6 is a view showing another manufacturing process of the electrical equipment unit shown in FIG. 1.

Subsequently, a manufacturing process of the electrical equipment unit will be described. FIGS. 4 to 6 are views illustrating the manufacturing process. First, as shown in FIG. 4, each of an insertion type electronic component 21, surface mount type electronic components 22 and 23, a connector 24, and an electronic component 3 is mounted on the substrate 1.

Next, as shown in FIG. 5, the substrate 1 after mounting is housed in a mold 9. The mold 9 is composed of an upper mold 9a and a lower mold 9b. A recess part 903 having the same shape as the contour of the covering part 5b is formed in the mold 9b. In other words, an inner surface of the mold 9b has a shape along with the contour of a part composed of the surface 1b and the electronic component 3.

A recess part 904 having the same shape as the contour of the side surface part 5a and a recess part 905 covering the electronic components 2 are formed in the mold 9a. A protruding part 901 protruding to a side of the substrate 1 may be provided in the recess part 904. The protruding part 901 is for forming a screw hole in a surface of the side surface part 5a at the opposite side of the substrate 1.

An inlet 902 for injecting the insulating resin 5 that is thermoplastic, for example, is provided to a matching surface of the molds 9a and 9b.

The substrate 1 is disposed in the mold 9b having such a configuration through insulating resin (not shown) which is melted by heat, for example. That is, a space for molding the insulating resin 5 is generated between the mold 9b and the substrate 1.

Then, the mold 9a is closed onto the mold 9b, matching the matching surfaces. Thereafter, thermoplastic insulating resin is injected from the inlet 902 to thermoset that insulating resin, thereby molding the insulating resin 5. As insulating resin, thermoset resin having curing temperature lower than heat resistant temperature of the electronic components 2, 3, and the substrate 1, or hot-melt resin having melting temperature lower than heat resistant temperature of the electronic components 2, 3, and the substrate 1 may be used.

Next, referring to FIG. 6, the substrate 1 is detached from the mold 9, and the connector 25 is coupled to the connector 24. Then, the wiring 7 is extracted through the trench 5c (see FIG. 2). Next, the lid 6 is disposed to the side surface part 5a from the opposite side of the substrate 1, and is fixed to the side surface part 5a with the screw 61. In this manner, the electrical equipment unit shown in FIG. 1 is manufactured.

As described above, a shape along the contour of the electronic component 3 is formed in the mold 9b. This electronic component 3 is comparatively short, thereby eliminating the need for enhancing the accuracy of the position and size of the electronic component 3, and the accuracy of the mold 9b. On the other hand, since the electronic components 2 including the insertion type electronic part 21 that is tall is air-tightly sealed with the side surface part 5a formed with the insulating resin 5 and the lid 6, it is unnecessary to be adhered and covered by insulating resin. Thus, it is unnecessary to form the shape along the contour of the electronic components 2 in the mold 9a, and it is not required to necessarily enhance the accuracy of the position and size of the electronic component 2, and the accuracy of the mold.

Further, the lid 6 is fixed to the side surface part 5a at the opposite side of the substrate 1, thereby not requiring the accuracy of the position of the side surface part 5a in a direction parallel to the substrate. Thus, the required accuracy of the mold is reduced in forming the contour of the side surface part 5a in the mold 9a. The necessity to enhance the accuracy of the side surface part 5a in a direction perpendicular to the substrate 1 is low, and thus the required accuracy of the mold in that direction is also low.

At least one or more electronic components 3 are provided on the surface 1b, and all the electronic components 3 have the heights lower than the maximum value of the height of the electronic components 2. The covering part 5b may adhere and cover all the electronic components 3. In this case, the size of the electrical equipment unit in the direction D is reduced.

Further, the connectors 24 and 25 are disposed in a space air-tightly and hermetically sealed (hereinafter, also referred to as a hermetic space), so that it is unnecessary to use an expensive connector for waterproof, thus suppressing the increase of the manufacturing cost.

When any of the electronic components 2 is broken, the broken electronic component 2 is easily repaired or exchanged by removing the lid 6, and thus improving the repair ability.

In the electrical equipment unit shown in FIG. 1, the height of the side surface part 5a adjacent to a pair of the electronic components 24 and 25, for example, is lower than the maximum value of the height of the electronic components 2 (height of the electronic component 21). This reduces the amount of the insulating resin. It will be described more in detail in the following. In the electrical equipment unit shown in FIG. 1, there exists the electronic component 21 higher than the pair of the electronic components 24 and 25 provided at the position adjacent to the side surface part 5a, for example. Then, the distance from the surface 1a to a side of the surface 1a of the lid 6 at the position in which the electronic component 21 is provided is longer than that from the surface 1a to the side of the surface 1a of the lid 6 at the position in which the pair of the electronic components 24 and 25 are provided. In this case, the height of the side surface part 5a adjacent to the pair of the electronic components 24 and 25 is suppressed, and the lid 6 is dented in accordance with the height of the pair of the electronic components 24 and 25, in addition to reduce the amount of resin. Thereby, the size of the electrical equipment unit is reduced.

In the electrical equipment unit shown in FIG. 1, the distance from the surface 1a to the side of the surface 1a of the lid 6 at the position in which the electronic component 23 is provided, is smaller than that from the surface 1a to the side of the surface 1a of the lid 6 at the position in which the electronic component 21 is provided. Thereby, the lid 6 is dented in accordance with the height of the electronic component 23, allowing to further reduce the size of the electrical equipment unit.

Figure 7:
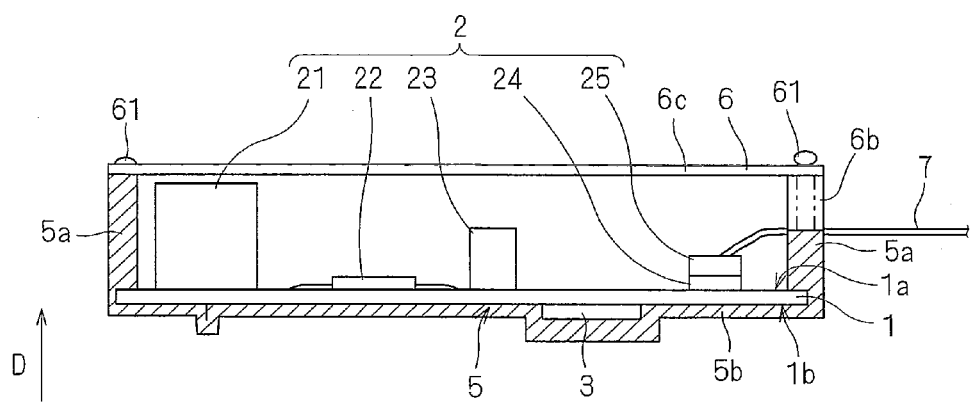
FIG. 7 is a block diagram schematically showing another example of the electrical equipment unit according to the first preferred embodiment.

In terms of suppressing the height of the side surface part 5a, the lid 6 may not necessarily have an uneven shape shown in FIG. 1. For instance, one example of the electrical equipment unit not having the uneven shape is shown in FIG. 7. FIG. 7 is a cross sectional view of another example of a schematic configuration of the electrical equipment unit. The lid 6 includes a side surface part 6b extending from the end of the side surface part 5a to the opposite side of the substrate 1 in the direction D, and a plane part 6c extending from the end of the side surface part 6b at the opposite side of the side surface part 5a to a direction parallel to the substrate 1.

A through hole extending in the direction D is provided in the side surface part 6b. This through hole extends to a portion of the plane part 6c overlapping with the side surface part 6b in the direction D. Further, a through hole extending in the direction D is provided in the plane part 6c overlapping with the side surface part 5a adjacent to the electronic component 21 in the direction D. Then, the side surface parts 5a and 6b are fixed by inserting the screws 61 into these through holes.

According to the electrical equipment unit having such a configuration, the height of the side surface part 5a is reduced by the height of the side surface part 6b in the direction D. Thus, the amount of resin composing the side surface part 5a is reduced, thereby allowing to reduce the manufacturing cost.

Second Preferred Embodiment

Figure 8:
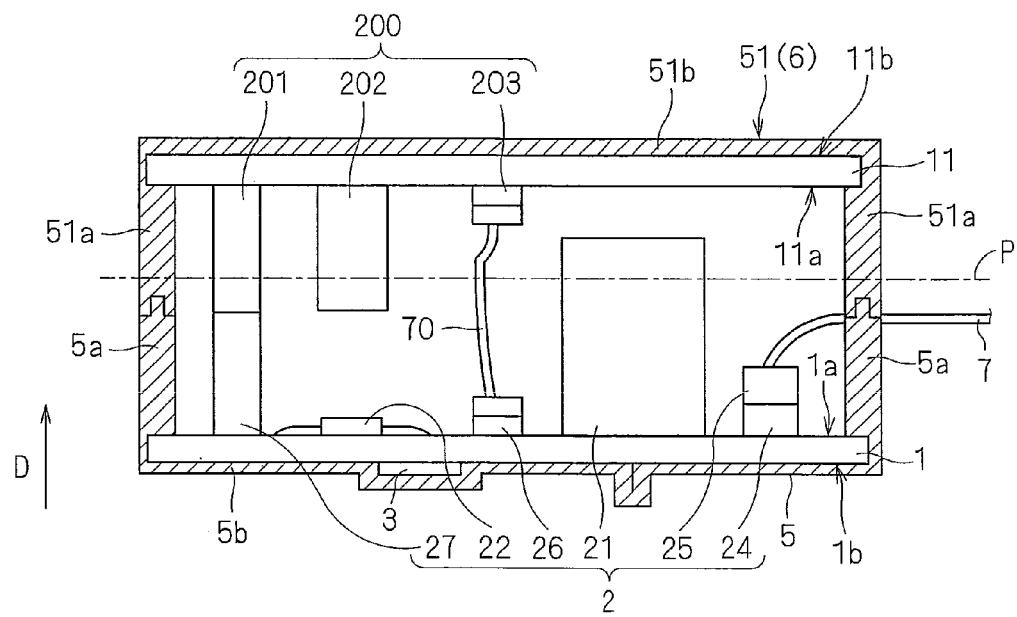
FIG. 8 is a block diagram schematically showing one example of an electrical equipment unit according to a second preferred embodiment.

FIG. 8 is block diagram schematically showing a cross section of one example of the electrical equipment unit according to a second preferred embodiment, seen from the direction parallel to the substrate 1.

An electrical equipment unit according to the second preferred embodiment includes substrates 1, 11, electronic components 2, 3, 200, and insulating resin 5, 51.

The substrate 1, the electronic components 2, 3, and the insulating resin 5 are same as those in the first preferred embodiment. However, in FIG. 8, an insertion type electronic component 21, a surface mount type electronic component 22, and connectors 24 to 27 are illustrated as the electronic components 2.

The substrate 11 is disposed to oppose to the substrate 1 in the direction D. The substrate 11 includes surfaces 11a and 11b opposing to each other in the direction D. The surface 11a is a surface at the side of the substrate 1 in the direction D.

Electronic components 200 are provided on the surface 11a. In FIG. 8, a connector 201, a surface mount type electronic component 202, and a connector 203 are illustrated as the electronic components 200.

The connectors 27 and 201 are straight header type connectors, for example, and are connected to each other in the direction D, electrically connecting the substrates 1 and 11. Connectors provided at both ends of the wiring 70 are connected to the connectors 26 and 203, respectively, and then the substrates 1 and 11 are electrically connected to each other with the connectors 26, 203, and the wiring 70.

The insulating resin 51 is a different body from the insulating resin 5, and is fixed to the side surface part 5a from the opposite side of the substrate 1, covering the substrate 11 from the opposite side of the substrate 1. More specifically, for example, the insulating resin 51 includes a covering part 51b adhering and covering the surface 11b, and a side surface part 51a extending to a side of the electronic components 200 in the direction D from the periphery of the substrate 11 so as to be continuous with the covering part 51b, for example. This insulating resin 51 is molded by injecting thermoset resin, for example, into a mold housing the substrate 11, similarly to the first preferred embodiment. The insulating resin 51 is also regarded as the lid 6 to the insulating resin 5.

The side surface parts 5a and 51a are fixed to each other in the direction D. For instance, on a contact surface of the side surface parts 5a and 51a, a recess part and a salient part fitting to each other are provided in the side surface parts 5a and 51a, respectively, so as to fix the side surface parts 5a and 51a by fitting these parts. The wiring 7 extends to outside through trenches provided in the side surface parts 5a and 51a, similarly to the first preferred embodiment.

As described above, the electrical equipment unit with two substrates 1 and 11 connecting to each other mounted thereon is provided, reducing the manufacturing cost in addition to exercise the same function, comparing to the mode connecting two electrical equipment units shown in FIG. 1 to each other with the wiring 7, for example.

Further, as shown in FIG. 8, the electronic components 200 are preferably adjacent to at least one of the electronic components 2 on a surface P perpendicular to the direction D. More specifically, each of the connector 201 and the surface mount type electronic component 202 out of the electronic components 200 is adjacent to the insertion type electronic component 21 on the surface P.

In this case, at least one of the electronic components 2 and at least one of the electronic components 200 are adjacent on the surface P, allowing to reduce the size of the electrical equipment unit in the predetermined direction D.

Further, the substrates 1 and 11 are electrically connected to each other in a space air-tightly sealed with the connectors 27, 201, the connectors 26, 203, and the wiring 70. Accordingly, it is unnecessary to use an expensive connector for waterproof, and thus suppressing the increase of the manufacturing cost.

An electronic component lower than the maximum value of the height of the electronic components 2 and 200 may be provided on the surface 11b. Even in this case, the required accuracy of the mold is reduced, similarly to the first preferred embodiment.

When any electronic components are not provided on the surface 11b, the surface 11b is not necessarily adhered and covered with the insulating resin 51. For instance, the insulating resin 51 may be molded independently of the substrate 11. In this case, a structure fitting and fixing to the substrate 11 may provided to the insulating resin 51 so as to attach the substrate 1 to the insulating resin 51 after molding the insulating resin 51. A spacer, for example, may be disposed between the substrates 1 and 11 so as to fix each of the substrates 1 and 11 at both ends of the spacer in the direction D.

Figure 9:
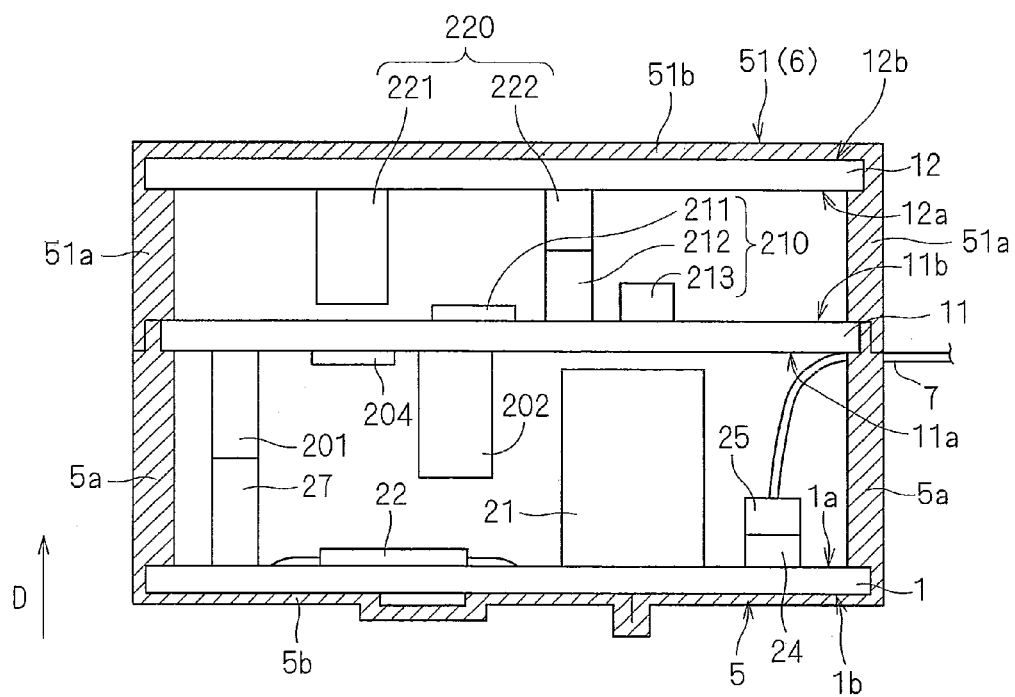
FIG. 9 is a block diagram schematically showing another example of the electrical equipment unit according to the second preferred embodiment.

FIG. 9 is a block diagram schematically showing a cross section of another example of the electrical equipment unit according to the second preferred embodiment, seen from a direction parallel to the substrate 1.

Comparing to FIG. 8, the electrical equipment unit further includes a substrate 12, electronic components 210, and electronic components 220.

The electronic components 210 are provided on the surface 11b. In FIG. 9, surface mount type electronic components 211, 213, and a connector 212 are illustrated as the electronic components 210.

The substrate 12 is disposed to oppose to the substrate 11 at the opposite side of the substrate 1 in the direction D. The substrate 12 includes a surface 12a opposing to the surface 11b in the direction D.

The electronic components 220 are provided on the surface 12a. In FIG. 9, a surface mount type electronic component 221 and a connector 222 are illustrated as the electronic components 220.

The connectors 212 and 222 are straight header type connectors, for example, and are connected to each other, electrically connecting the substrates 11 to 12.

The insulating resin 51 covers the substrate 12 at the opposite side of the substrate 1. More specifically, the insulating resin 51 includes a covering part 51b covering a surface 12b of the substrate 12 positioned at the opposite side of the surface 12a, and a side surface part 51a extending to a side of the electronic components 220 toward the direction D from the periphery of the substrate 12 so as to be continuous with the covering part 51b, for example, and then, is fixed to the side surface part 5*a* similarly to the insulating resin 51 shown in FIG. 8. The insulating resin 51 may be regarded as the lid 6 to the insulating resin 5.

The substrate 11 may be fixed by grasping the substrate 11 with the side surface parts 5*a* and 51*a*, for example. A spacer may be disposed and fixed between the substrate 1 and the substrate 11.

As described above, the electrical equipment unit with a plurality of the substrates 1, 11, and 12 connecting to one another mounted thereon is provided, reducing the manufacturing cost in addition to exercise the same function, comparing to the mode connecting three electrical equipment units shown in FIG. 1 to one another with the wiring 7, for example.

As shown in FIG. 9, the electrical components 220 are preferably adjacent to at least one of the electrical components 210 on a surface perpendicular to the direction D. More specifically, the surface mount type electronic component 221 is adjacent to the connector 212 and the surface mount type electronic component 213 on that surface.

In this case, the size of the electrical equipment unit in the direction D is reduced with the plurality of the substrates 1, 11, and 12 mounted thereon.

Third Preferred Embodiment

An electrical equipment unit according to a third preferred embodiment will be described. In the electrical equipment unit according to the first preferred embodiment and the second preferred embodiment, there is a case that heat generated from the electronic components is accumulated in the electrical equipment unit. Therefore, an object of the electrical equipment unit according to the third preferred embodiment is to radiate heat of the electronic equipments.

Figure 10:
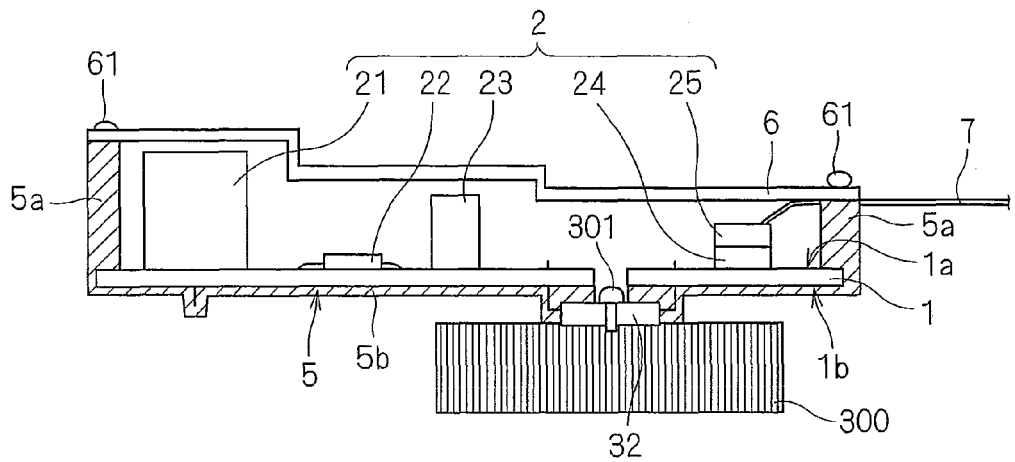
FIG. 10 is a block diagram schematically showing one example of an electrical equipment unit according to a third preferred embodiment.

FIG. 10 is a block diagram schematically showing one example of a cross section of the electrical equipment unit according to the third preferred embodiment, seen from a direction parallel to the substrate 1. Comparing to the first preferred embodiment, the electrical equipment unit according to the third preferred embodiment includes a radiator 300.

In FIG. 10, an electronic component 32 that is a Dual Inline Package (DIP) type integrated circuit chip, for example, is illustrated as the electrical component 3.

The radiator 300 is a metallic heat sink, for example, and is attached to the electronic component 32 on a surface at the opposite side of the surface 1*b*, radiating the electronic component 32. In FIG. 10, the radiator 300 is attached to the electronic component 32 by screwing.

The covering part 5*b* included in the insulating resin 5 adheres and covers the electronic component 32 except at least the contact part with the radiator 300. The radiator 300 makes contact with the covering part 5*b* from the opposite side of the substrate 1. In FIG. 10, a through hole is provided to the covering part 5*b* for screwing the electronic component 32 and the radiator 300. The surface 1*b* is in communication with a surface at the side of the surface 1*b* of the electronic component 32 through this through hole. A through hole through which the surface 1*a* is in communication with the surface 1*b* is provided to the substrate 1 so as to be continuous with this through hole.

A screw 301 fixes the electronic component 32 and the radiator 300 through these through holes.

Subsequently, a manufacturing method of the electrical equipment unit will be described. First, the electronic components 2 and 32 are mounted on the substrate 1. A through hole is provided to the substrate 1 in the direction D.

Figure 11:
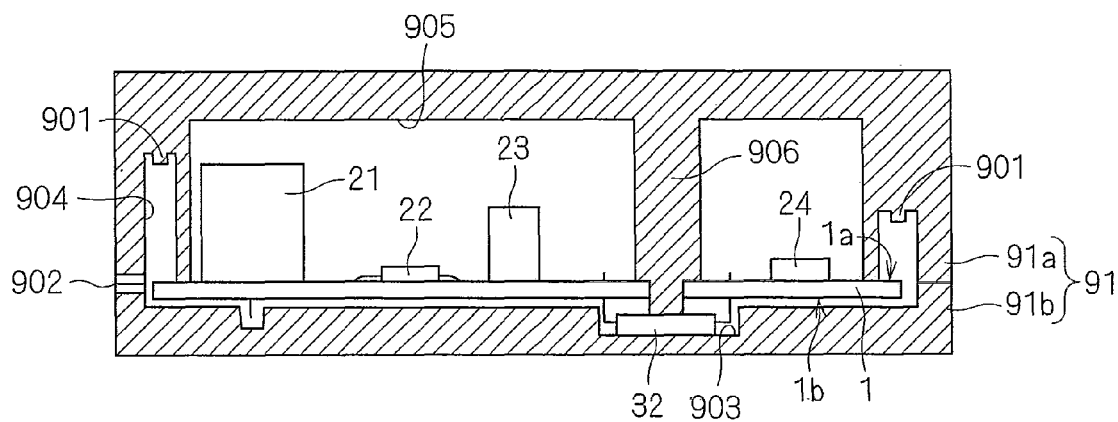
FIG. 11 is a view showing a process of manufacturing the electrical equipment unit shown in FIG. 10.

Next, as shown in FIG. 11, the substrate 1 after mounting is housed in a mold 91. The mold 91 includes an upper mold 91*a* and a lower mold 91*b*. Similarly to the first preferred embodiment, a recess part 904 having the same shape as the contour of the side surface part 5*a* and a recess part 905 covering the electronic components 2 are formed in the mold 91*a*. The mold 91*a* extends to the electronic component 32 through the through hole provided on the substrate 1, and includes a through hole forming part 906 abutting the electronic component 32.

A recess part 903 having a shape along the contour of the surface 1*b* and the electronic component 32 is formed in the mold 91*b*. It should be noted that a surface of the electronic component 32 at the opposite side of the surface 1*b* makes contact with the mold 91*b*.

Then, similarly to the first preferred embodiment, for example, thermoplastic insulating resin is injected into an inlet 902 provided to a matching surface of the molds 9*a* and 9*b* so as to be thermoset to mold the insulating resin 5.

Figure 12:
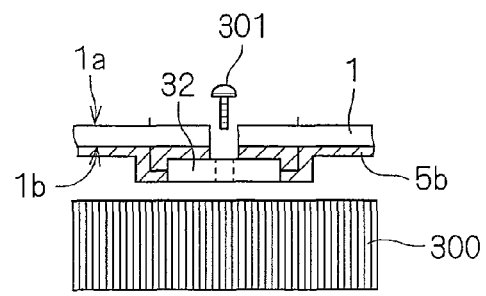
FIG. 12 is a view showing another process of manufacturing the electrical equipment unit shown in FIG. 10.

Thereafter, the mold 91 is detached, and the radiator 300 is attached to the electronic component 32. FIG. 12 is a block diagram schematically showing a part of the electrical equipment unit when the radiator 300 is attached to the electronic component 32. As shown in FIG. 12, the screw 301 is inserted into the through hole from the side of the surface 1*a* so as to fix the electronic component 32 and the radiator 300 by screwing.

As described above, in the electronic equipment unit according to the third preferred embodiment, the radiator 300 is attached to the electronic component 32 after the electronic component 32 is covered with the insulating resin 51 except the contact part. Thus, it is unnecessary to house the radiator 300 in the mold 91 so that there is no need for forming a shape of the radiator 300 to the mold 91, thereby reducing the required accuracy of the mold 91.

Fourth Preferred Embodiment

An electrical equipment unit according to a fourth preferred embodiment will be described. While the heat of the electronic component 32 is radiated in the electrical equipment unit according to the third preferred embodiment, it is difficult to radiate the heat of the electronic components 2. Also, a radiator is needed to be newly attached, thereby causing the increase of the manufacturing cost. It is therefore an object of the fourth preferred embodiment to suppress the increase of the manufacturing cost and radiate the heat of the electronic components 2.

Figure 13:
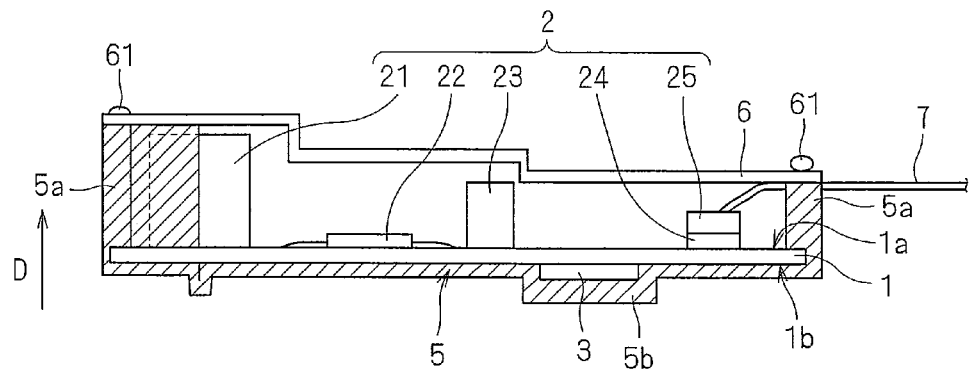
FIG. 13 is a block diagram schematically showing one example of an electrical equipment unit according to a fourth preferred embodiment.
Figure 14:
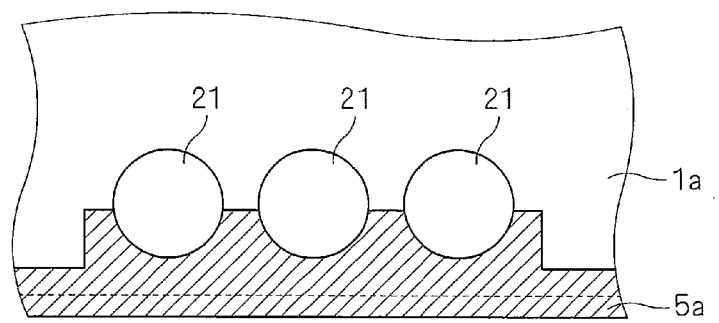
FIG. 14 is a plane view schematically showing a part of one example of the electrical equipment unit according to the fourth preferred embodiment.

FIG. 13 is a block diagram schematically showing a cross section of one example of the electrical equipment unit according to the fourth preferred embodiment, seen from a direction parallel to the substrate 1. FIG. 14 is a plane view schematically showing a part of the electronic component 21 in the electrical equipment unit. It should be noted that the lid 6 is removed. Comparing to the first preferred embodiment, the side surface part 5*a* adheres and covers at least a part of one of the electronic components 2. More specifically, the side surface part 5*a* adheres and covers a part of the electronic component 21, for example. In FIG. 14, the side surface part 5*a* adhering and covering each part of three electronic components 21 is illustrated.

Subsequently, a manufacturing method of the electrical equipment unit will be described. First, each of the electronic components 2 and 3 is mounted on the substrate 1.

Figure 15:
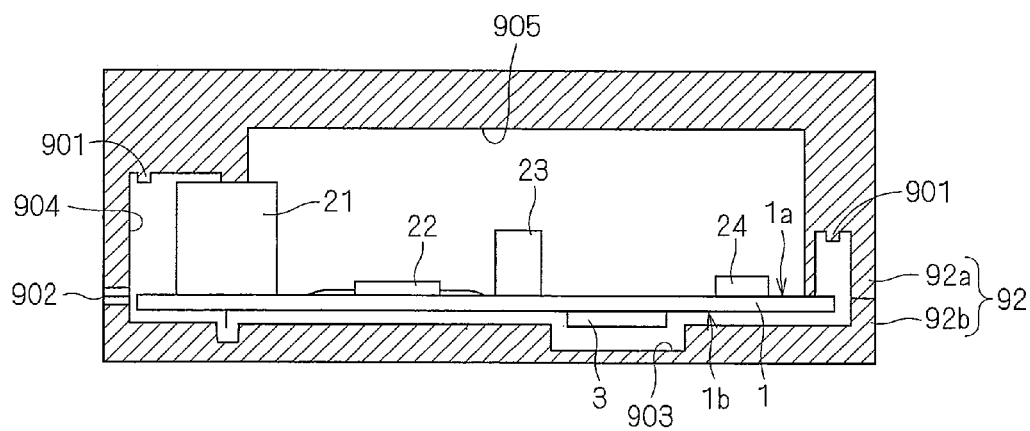
FIG. 15 is a view showing a process of manufacturing the electrical equipment unit shown in FIG. 12.

Next, as shown in FIG. 15, the substrate 1 after mounting is housed in a mold 92. The mold 92 includes an upper mold 92*a* and a lower mold 92*b*. The mold 92*b* is identical to the mold 9*b* described in the first preferred embodiment. While the mold 92*a* is almost identical to the mold 9*a* described in the first preferred embodiment, an inner surface of the side surface part 5a (a surface at the side of the electronic component 21) has a shape of a part of the contour of the electronic component 21 so as to reflect the shape of the part of the electronic component 21.

Thereafter, the electrical equipment unit shown in FIG. 13 is manufactured by the same process as the first preferred embodiment.

In the electrical equipment unit according to the fourth preferred embodiment, for instance, when the temperature in the hermetic space at the side of the electronic components 2 is high and the temperature outside the electrical equipment unit is low, the electronic component 21 radiates heat to outside through the side surface part 5a, thereby allowing to improve the effect of heat radiation of the electronic component 21. It is desirable to use resin having a high heat transfer coefficient as the insulating resin 51.

Fifth Preferred Embodiment

An electrical equipment unit according to a fifth preferred embodiment will be described. It is difficult to radiate the heat of the electronic components 2 in the third preferred embodiment. Also, in the fourth preferred embodiment, since radiation is conducted through the side surface part 5a that is resin, there is a case that the sufficient effect of the heat radiation is not expected. It is therefore an object of the fifth preferred embodiment to further improve the effect of the heat radiation of the electronic components 2.

FIG. 16 is a cross sectional view showing a conceptual configuration of the electrical equipment unit. Comparing to the electrical equipment unit shown in FIG. 1, a radiator 304 is further included. The radiator 304 is, for example, formed of metal material, and is interposed between the electronic component 21 and the lid 6, making contact with the electronic component 21 and the lid 6. This promotes the transfer of the heat generated from the electronic component 21 to outside through the radiator 304 and the lid 6, thereby allowing to improve the heat radiation of the electronic component 21.

In the case where the electronic component 21 can be electrically in contact with the radiator 304, the radiator 304 has preferably insulating properties. In this case, for instance, the radiator 304 may be resin having high thermal conductivity and insulating properties. Thereby, property degradation and failure of the electrical component 21 are prevented.

Figure 17:
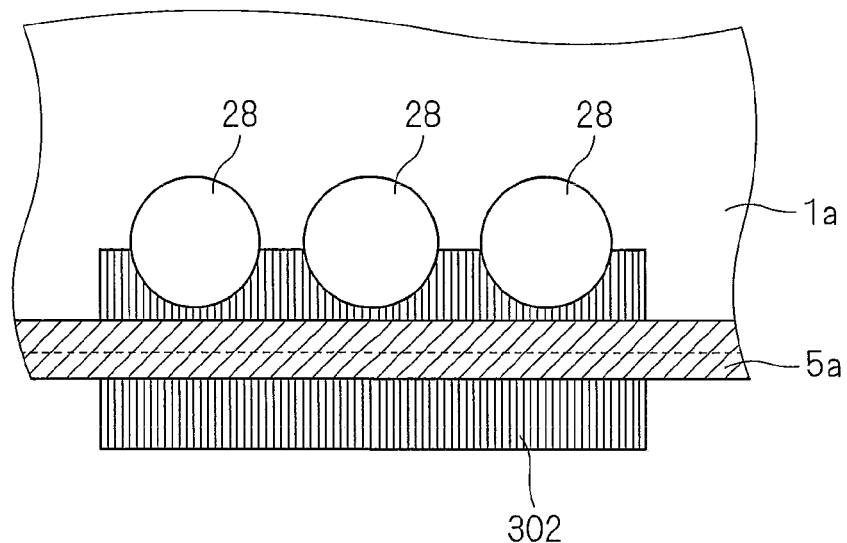
FIG. 17 is a plane view schematically showing a part of another example of the electrical equipment unit according to the fifth preferred embodiment.

FIG. 17 is a block diagram schematically showing a plane of a part of another example of the electrical equipment unit. It should be noted that the lid 6 is removed. Comparing to the first preferred embodiment, the electrical equipment unit further includes a radiator 302. The radiator 302 is a metallic heat sink, for example, and is attached to at least one of the electronic components 2, extending to outside through the side surface part 5a.

More specifically, the radiator 302 is adhered and attached to a part of the electronic component 28 that is one example of electronic components 2, penetrating the side surface part 5a to extend to outside. In FIG. 17, the radiator 302 adhered and attached to three electronic components 21 is illustrated.

Subsequently, a manufacturing method of the electrical equipment unit will be described. First, each of the electronic components 2 and 3 is mounted on the substrate 1. Then, the radiator 302 is attached to the electronic component 28. For instance, the radiator 302 may be attached on the surface 1a after adhering to the electronic component 28.

Figure 18:
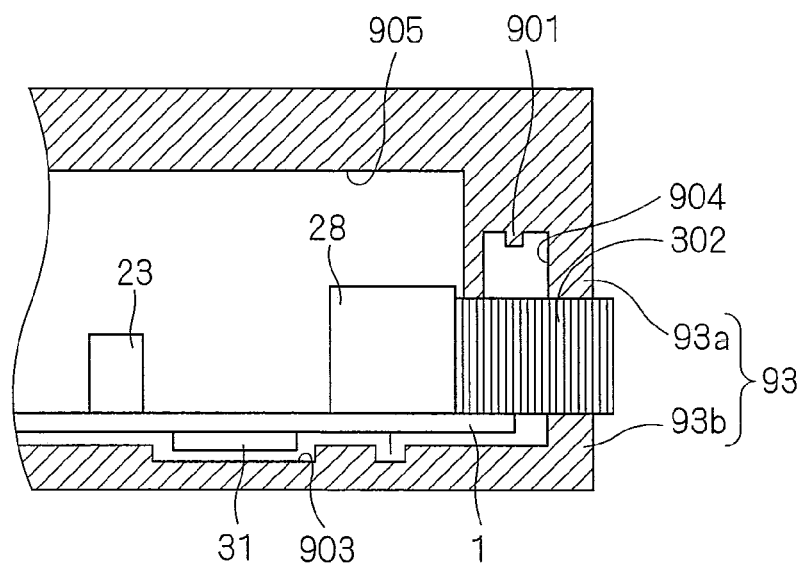
FIG. 18 is a view showing a process of manufacturing the electrical equipment unit shown in FIG. 17.

Next, as shown in FIG. 18, the substrate 1 after mounting is housed in a mold 93. The mold 93 includes an upper mold 93a and a lower mold 93b. The mold 93b is identical to the mold 9b described in the first preferred embodiment. While the mold 93a is almost identical to the mold 9a described in the first preferred embodiment, an inner surface of the recess part 904 (a surface at the side of the radiator 302) has a shape of a part of the contour of the radiator 302 so as to mold the side surface part 5a through which the radiator 302 penetrates.

Thereafter, the electrical equipment unit is manufactured by the same process as the first preferred embodiment.

In the electrical equipment unit according to the fifth preferred embodiment, the heat generated from the electronic component 28 is radiated to outside through the radiator 302 having high thermal conductivity, allowing to further improve the effect of the heat radiation of the electronic component 21.

Sixth Preferred Embodiment

A sixth preferred embodiment will be described. In the first preferred embodiment, a connector is housed and a wiring is extracted from the electrical equipment unit so as to connect the electrical equipment unit to an external device. It is therefore an object of the sixth preferred embodiment to connect the electrical equipment unit to an external device by not using a connector, thereby reducing the manufacturing cost.

Figure 19:
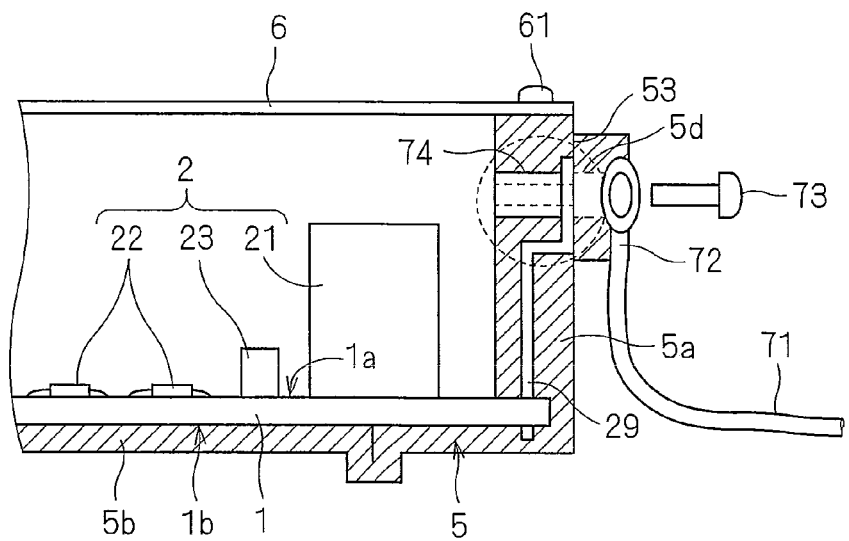
FIG. 19 is a plane view schematically showing a part of one example of an electrical equipment unit according to a sixth preferred embodiment.

FIG. 19 is a block diagram schematically showing one example of a cross section of a part of the electrical equipment unit according to the sixth preferred embodiment, seen from a direction parallel to the substrate 1.

Comparing to the first preferred embodiment, the electrical equipment unit further includes a connection structure 53. The connection structure 53 is buried in the side surface part 5a so as to electrically connect the external wiring 71 to the substrate 1. The external wiring 71 is a wiring for connecting to the external device.

More specifically, the connection structure 53 includes a lead frame 29 and a conductive female screw 74. One end of the lead frame 29 is connected to the substrate 1. In FIG. 19, the entire lead frame 29 is buried in the side surface part 5a, extending from the substrate 1 to the direction D.

The female screw 74 makes contact with the other end of the lead frame 29, and is buried in the side surface part 5a. The side surface part 5a has a shape so as to screw the female screw 74 and a screw 73 from outside. For instance, the side surface part 5a includes a through hole 5d penetrating to outside in communication with a screw hole of the female screw 74, and the conductive screw 73 is inserted into the female screw 74 through this through hole 5d.

The external wiring 71 includes a metal part 72 at one end. The metal part 72 has a ring-like shape, for example.

Then, the screw 73 is inserted into the female screw 74 through this metal part 72 and the through hole 5d. Thus, the external wiring 71 is electrically connected to the substrate 1 through the metal part 72, the screw 73, the female screw 74, and the lead frame 29.

The electrical equipment unit having the above configuration is manufactured by, for example, molding the insulating resin 5 with a predetermined mold after connecting the lead frame 29 fixed to the female screw 74 to the substrate 1, and thereafter providing the through hole 5d and attaching the lid 6. When the female screw 74 is exposed to outside, the through hole 5d is not required.

According to the electrical equipment unit of the present preferred embodiment, the connection structure 53 electrically connecting a substrate to outside is integrally molded with the insulating resin 5. Thus, there is no need to provide a connector to a substrate, thereby reducing the manufacturing cost.

Figure 20:
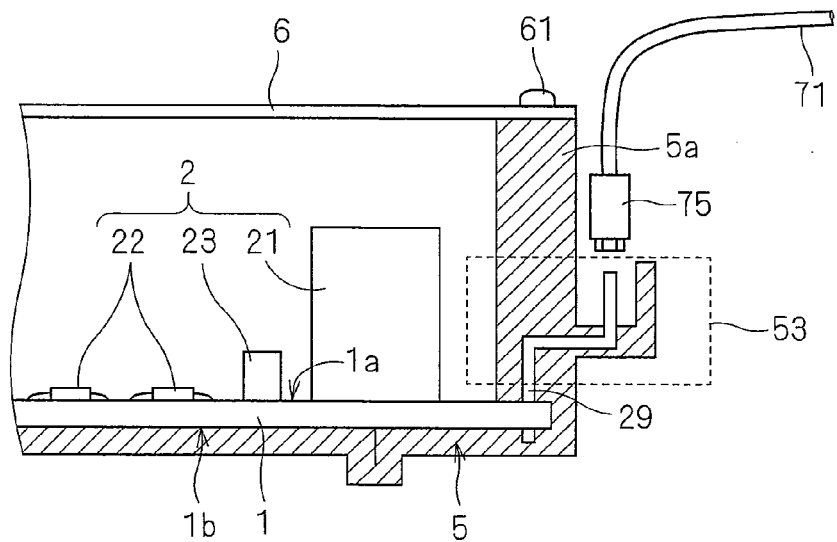
FIG. 20 is a plane view schematically showing a part of another example of the electrical equipment unit according to the sixth preferred embodiment.

FIG. 20 is a block diagram schematically showing another example of a cross section of a part of the electrical equipment unit according to the sixth preferred embodiment, seen from a direction parallel to the substrate 1. Comparing to FIG. 19, the connection structure 53 is different.

More specifically, one end of the lead frame 29 is connected to the substrate 1, and the other end extends to outside through the side surface part 5a. In FIG. 20, the lead frame 29 is buried in the side surface part 5a at one end connected to the substrate 1.

The side surface part 5a has a connector-like shape so as to surround a part of the lead frame 29 extending to outside. More specifically, the side surface part 5a has a shape surrounding this part with an extending direction of this part as a center.

The external wiring 71 includes a connector 75 at one end. The external wiring 71 is electrically connected to the substrate 1 through the lead frame 29 by connecting this connector 75 to the lead frame 29.

The electrical equipment unit having the above configuration is manufactured by molding the insulating resin 5 with a predetermined mold after mounting the electronic components 2 and 3 on the substrate 1 and connecting the lead frame 29 to the substrate 1, and attaching the id 6.

Even in this electrical equipment unit, the connection structure 53 electrically connecting the substrate 1 to outside is integrally molded with the insulating resin 5. Further, the other end of the lead frame 29 is easily and electrically connected to the connector 75 provided to the external wiring 71 as a connector terminal.

While the invention has been shown and described in detail, the foregoing description is in all aspects illustrative and not restrictive. It is therefore understood that numerous modifications and variations can be devised without departing from the scope of the invention.

The invention claimed is:

1. An electrical equipment unit, comprising:
   a substrate including a first surface and a second surface opposing to each other in a predetermined direction;
   at least one or more first electronic components provided on said first surface;
   at least one or more second electronic components provided on said second surface;
   an insulating resin including a covering part which adheres and covers said second surface and at least one of said second electronic components having a height lower than a maximum value of a height of said first electronic components in said predetermined direction, and a side surface part extending from a periphery of said substrate to a side of said first electronic components in said predetermined direction; and
   a lid which is a different body from said insulating resin and fixed to one end of said side surface part at an opposite side of said substrate, said one end being an end of said side surface part extending away from the periphery of said substrate in said predetermined direction, said lid covering said first electronic components from the opposite side of said substrate.

2. The electrical equipment unit according to claim 1, wherein the height of said side surface part in said predetermined direction is lower than the maximum value of the height of said first electronic components.

3. The electrical equipment unit according to claim 2, wherein
   a plurality of said first electronic components are provided on said first surface, each having different height in said predetermined direction,
   said height of one of said first electronic components provided at a position adjacent to said side surface part is lower than that of any one of other said first electronic components, and
   a distance from said first surface to said lid at a side of said first surface at the position where said one of said first electronic components is provided, is smaller than that from said first surface to said lid at a side of said first surface at the position where said any one of other said first electronic components having said height higher than that of said one of said first electronic components is provided.

4. The electrical equipment unit according to claim 2, wherein
   said lid includes:
   a second side surface part extending from said one end of said side surface part at the opposite side of said substrate in said predetermined direction; and
   a plane part extending from one end of said second side surface part at the opposite side of said substrate in a direction parallel to said substrate.

5. The electrical equipment unit according to claim 1, further comprising:
   a second substrate disposed to oppose to said substrate in said predetermined direction; and
   third electronic components provided on a surface of said second substrate at a side of said substrate,
   wherein said lid covers said second substrate at the opposite side of said substrate.

6. The electrical equipment unit according to claim 5, further comprising:
   fourth electronic components provided on a surface of said second substrate at the opposite side of said substrate;
   a third substrate disposed to oppose to said second substrate at the opposite side of said substrate in said predetermined direction; and
   fifth electronic components provided on a surface of said third substrate at a side of said second substrate,
   wherein said lid covers said third substrate from the opposite side of said substrate.

7. The electrical equipment unit according to claim 1, wherein at least one of said first electronic components is a connector, and
   the electrical equipment unit further comprising:
   trenches provided at a boundary of said lid and said side surface part; and
   a wiring electrically connected to said connector and extending to outside through said trenches.

8. The electrical equipment unit according to claim 1, further comprising:
   a sixth electronic component provided on said second surface and having the height lower than the maximum value of the height of said first electronic components in said predetermined direction; and
   a radiator attached to said sixth electronic component at an opposite side of said second surface, making contact therewith, wherein
   said covering part covers said sixth electronic component except at least the contact part with said radiator, and
   said radiator makes contact with said covering part from the opposite side of said substrate.

9. The electrical equipment unit according to claim 1, wherein said side surface part covers a part of at least one of said first electronic components.

10. The electrical equipment unit according to claim 1, further comprising,
a second radiator attached to at least one of said first electronic components and extending to outside through said side surface part.

11. The electrical equipment unit according to claim 1, further comprising,
a connecting mechanism buried in said side surface part and electrically connecting said substrate to an external wiring.

12. The electrical equipment unit according to claim 11, wherein
said connecting mechanism includes:
a lead frame, one end of which is electrically connected to said substrate; and
a conductive female screw making contact with said lead frame and buried in said side surface part to fix said external wiring by screwing.

13. The electrical equipment unit according to claim 11, wherein
said connecting mechanism includes:
a lead frame, one end of which is electrically connected to said substrate, and extending to outside through said side surface part, and
said side surface part has a connector-like shape surrounding said lead frame with respect to an extending direction of said lead frame extending at the other end.

14. The electrical equipment unit according to claim 1, further comprising,
a sealing member air-tightly sealing between said lid and said side surface part.

15. The electrical equipment unit according to claim 1, further comprising,
a heat transfer member making contact with said first electronic components and said lid.

* * * * *